United States Patent [19]
Shintaku et al.

[11] Patent Number: 5,194,808
[45] Date of Patent: Mar. 16, 1993

[54] MAGNETIC FIELD DETECTOR USING A SUPERCONDUCTOR MAGNETORESISTIVE ELEMENT WITH AC AND DC BIASING AND A SIGNAL PROCESSOR USING FOURIER TRANSFORM

[75] Inventors: Hidetaka Shintaku; Masayoshi Koba, both of Nara, Japan

[73] Assignee: Sharp Kabushiki Kaisha, Osaka, Japan

[21] Appl. No.: 703,671

[22] Filed: May 21, 1991

[30] Foreign Application Priority Data

May 21, 1990 [JP] Japan ................... 2-130481

[51] Int. Cl.$^5$ ............... H01B 12/02; G01R 33/035; H01L 39/16; H01L 39/12
[52] U.S. Cl. .................... 324/248; 324/252; 505/845
[58] Field of Search .............. 324/248, 252, 262; 505/845, 846

[56] References Cited

U.S. PATENT DOCUMENTS 4,906,607 3/1990 Tyagi .
5,011,818 4/1991 Katoka et al. .

FOREIGN PATENT DOCUMENTS 0301902 1/1989 European Pat. Off. .
0323187 7/1989 European Pat. Off. .
0349996 1/1990 European Pat. Off. .
0350959 1/1990 European Pat. Off. .

OTHER PUBLICATIONS

Nakanishi et al., "Integrated DC-Squid Magnetometer", Japanese Journal of Applied Physics, vol. 26, No. 7, pp. 1050–1055.

Primary Examiner—Walter E. Snow

[57] ABSTRACT

The superconductor magneto-resistive element 14 is installed in a center portion surrounded by two coils 15 and 16 which generate A.C. and D.C. bias magnetic fields respectively. The coils 15 and 16 are respectively connected to A.C. and D.C. power sources for applying A.C. and D.C. bias magnetic field to the element 14.

With the output signal of the element 14, the fundamental component having the frequency component same as that of the A.C. bias magnetic field and the quadratic harmonic component having the frequency component twice as that of the fundamental component are calculated using the Fourier transform. The calculated value of the fundamental component is divided by the value of the quadratic harmonic component, thereby removing the change of the output signal of the element 14 due to the fluctuation inherent in the element 14, enabling to measure an external magnetic field with high accuracy.

5 Claims, 8 Drawing Sheets

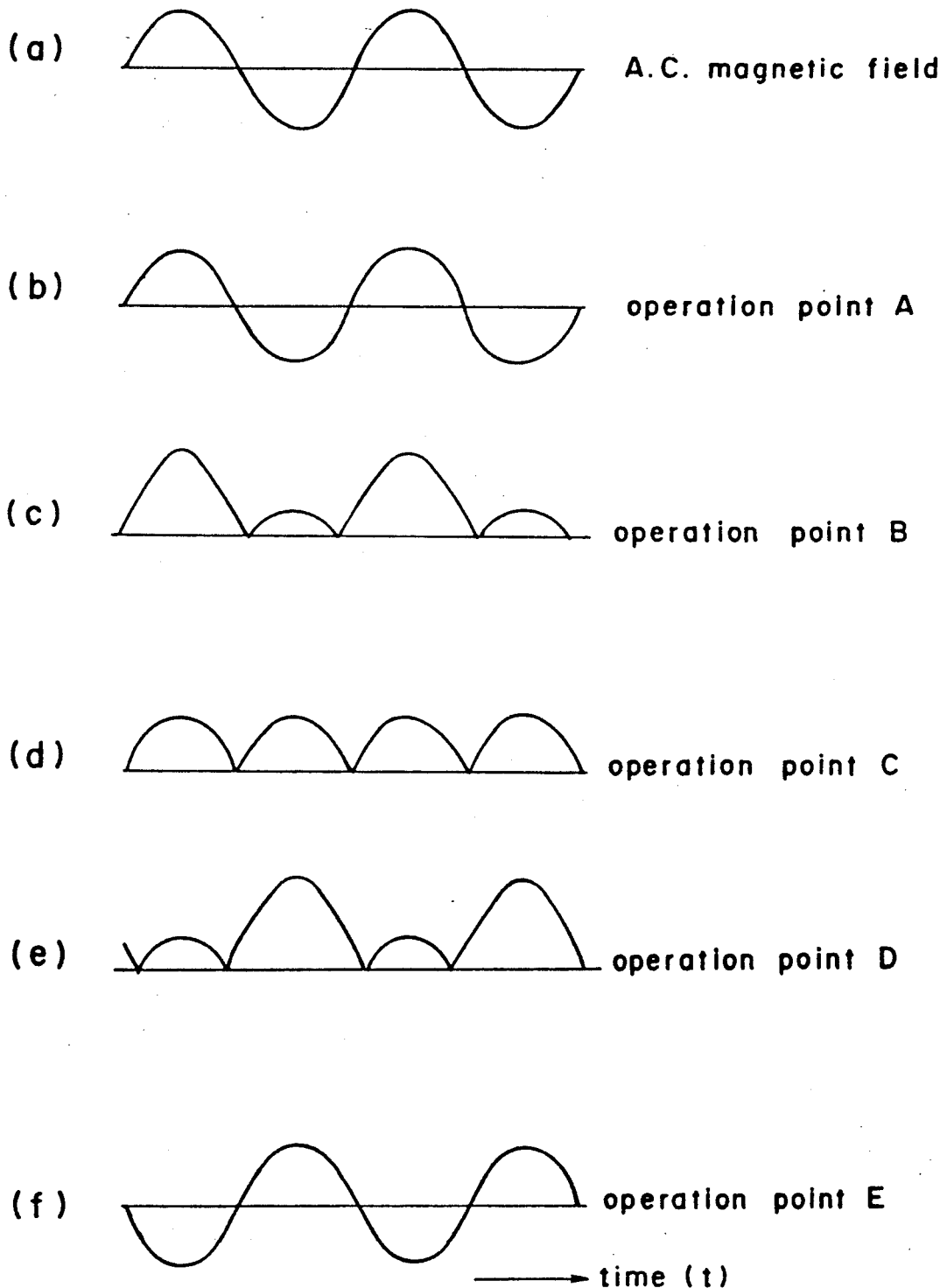

MAGNETIC FIELD DETECTOR USING A SUPERCONDUCTOR MAGNETORESISTIVE ELEMENT WITH AC AND DC BIASING AND A SIGNAL PROCESSOR USING FOURIER TRANSFORM

BACKGROUND OF THE INVENTION

1. Field of the Invention

The present invention relates to an improvement of a system for sensing a magnetic field with use of a superconductor magneto-resistive element of superconductive material, and in particular to an improvement of measurement accuracy in a high sensitive superconductor magnetic field sensor system having a bias magnetic field applied to the magneto-resistive element constructed of the superconductive material having weak coupling grain boundaries.

2. Description of the Prior Art

Conventionally, a magnetic sensor utilizing a hall effect of magneto-resistive effect in a semiconductor or in a magnetic material is widely used for sensing or measuring a magnetic field. In particular, there is utilized a magneto-resistive element using a shape effect in a semiconductor with high speed electron mobility such as InSb and InAs, or using an orientation effect in a ferro magnetic metal such as Fe-Ni, Co-Ni.

In addition, there has been developed a method for sensing and measuring a feeble magnetic field utilizing a magneto-resistive effect of a superconductor oxide made of superconductive material with grain boundaries weakly bonded.

In the conventional magneto-resistive element using a semiconductive material or magnetic material, since the sensitivity of measuring a magnetic field is low when the magnetic field is in a low or weak range, a bias magnetic field is applied to the weak magnetic field to be measured using such as a permanent magnet so as to transfer the low range of the magnetic field to a high sensitive range to be measured by the magneto-resistive element. Even in this case, however, it has been difficult to measure such a feeble magnetic field with good accuracy.

In a method of measuring a magnetic field using a superconductor magneto-resistive element, when there is applied a magnetic field of a predetermined intensity greater than a threshold value determined depending on the value of the bias current flowing through the element, the superconductive condition of the element is broken and transited to a normal conductive condition. Therefore, in the region greater than the threshold at this transition point, the resistance value of the element is abruptly increased so as to generate the output voltage proportional to the resistance value, thereby obtaining a high sensitive measurement of a magnetic field in this region thereof.

In such a superconductor magneto-resistive element, however, there occurs a fluctuation phenomenon in a low frequency range smaller than 10 hertzs of a fluctuation of an output of the element. Therefore, it has been difficult to measure a feeble magnetic field applying a D.C. bias magnetic field or A.C. bias magnetic field less than 10 Hz. Moreover, there occurs a change in the output voltage value of the element due to a temperature fluctuation inherent in the superconductor magneto-resistive element when the element is cooled to hold the superconductive state, and the change in the output of the element due to the temperature fluctuation can not be corrected.

SUMMARY OF THE INVENTION

It is, therefore, an object of the present invention is to eliminate such a problem as mentioned in the conventional method of measuring a magnetic field using a magneto-resistive effect, and its essential object is to provide a magnetic field sensor system for sensing a magnetic field with high accuracy and good efficiency utilizing a superconductor magneto-resistive element.

In a magnetic field sensor system according to the present invention, a magnetic field is measured with an appropriate frequency of a bias magnetic field which is not affected by a noise due to a natural low frequency fluctuation inherent in a superconductor magneto-resistive element having grain boundaries weakly bonded so that the measurement error due to the fluctuation is avoided. Furthermore, there is applied an A.C. bias magnetic field in such a high frequency range that the natural fluctuation inherent in the superconductor magneto-resistive element does not cause a measurement error, and then the frequency components corresponding to the applied A.C. bias magnetic field and the quadratic harmonic components are taken out of the output of the superconductor magneto-resistive element, whereby the fluctuation of the output due to the temperature of the element is corrected by a calculation using the above frequency component and quadratic harmonic component, so that the intensity of the external magnetic field can be accurately measured with high sensitivity.

Moreover, the magnetic field sensor system mentioned above includes means for applying D.C. bias magnetic field capable of varying the intensity of the D.C. magnetic field to be applied to the superconductor magneto-resistive element for use therein.

According to a feature of the present invention, the magnetic field sensor system further includes means for applying a high frequency A.C. bias magnetic field which is not affected by the fluctuation of a natural low frequency of the element, and calculation means using the frequency component of the A.C. bias magnetic field corresponding to the applied A.C. bias magnetic field and quadratic harmonic components taken out of the output signal of the element, whereby it becomes possible to correct the change of the output of the element due to the temperature fluctuation of the element caused when the element is cooled to be set in the superconductive state, so that even a feeble magnetic field can be accurately measured with high sensitivity.

The features of the present invention which are believed to be novel are set forth with particularity in the appended claims. The present invention together with further objects and advantages thereof may best be understood with reference to the following detailed description, taken in conjunction with the accompanying drawings.

BRIEF DESCRIPTION OF THE DRAWINGS

FIGS. 6(a) to 6(f) are schematic diagrams showing output waveforms in relation to the D.C. bias magnetic fields.

DETAILED DESCRIPTION OF THE PREFERRED EMBODIMENT

A preferred embodiment of the present invention is described hereinafter with reference to the attached drawings.

Figure 1A:
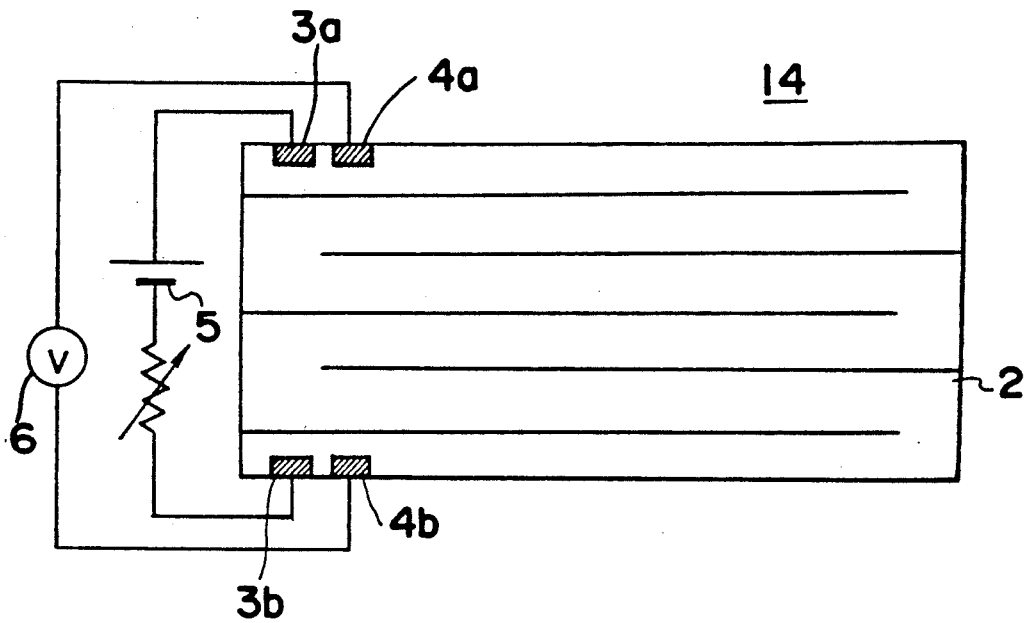
FIGS. 1(a) and 1(b) plan and sectional views showing a structure of the embodiment of the superconductor magneto-resistive element for use in the embodiment of a superconductor magnetic field sensor system according to the present invention.
Figure 1B:
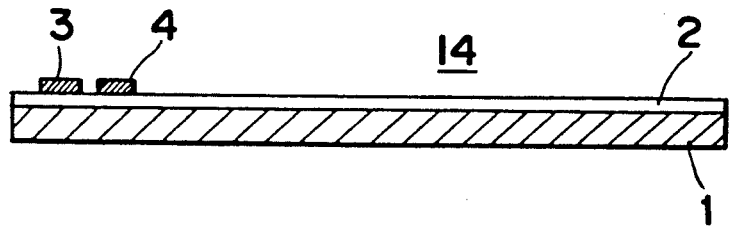

FIGS. 1(a) and 1(b) show a structure of a superconductor magneto-resistive element 14 used in a preferred embodiment of a magnetic field sensor system according to the present invention. The element 14 consists of a substrate 1 made of non-magnetic substance and a superconductor film 2 formed thereon. The superconductor film 2 is composed of a coalescence of fine grains of oxide superconductive material, wherein the fine grains are weakly coalesced in a point-to-point manner or weakly bonded through a thin insulation film or normal conducting film each other. The superconductor film 2 is formed in a return meander shape by cutting the superconductor film 2 by slits using a cutting machine, having a pair of current terminals 3a and 3b and a pair of voltage terminals 4a and 4b formed by vaporing titanium (Ti) material onto both of the side portions on the upper surface of the superconductor film 2.

The current terminals 3a and 3b are connected to a stabilized current source 5 to flow a constant current therebetween, and a voltmeter 6 is connected across the voltage terminals 4a and 4b for measuring the output voltage of the element 14, so that the resistance in the superconductor magneto-resistive element 14 is measured depending on a voltage generated across the voltage terminals 4a and 4b.

Figure 2:
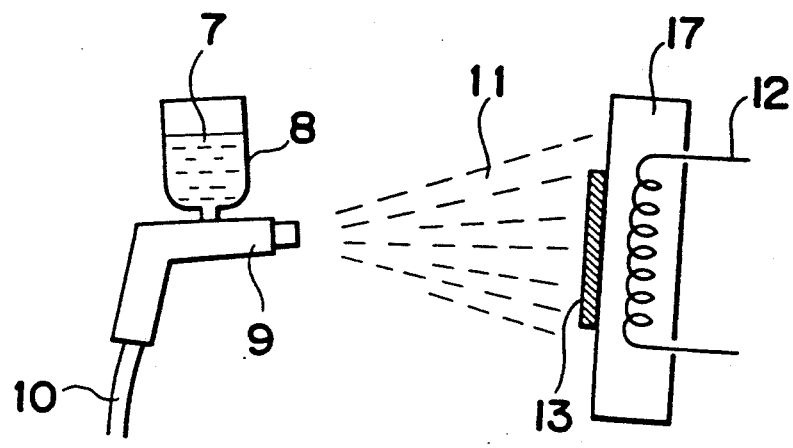
FIG. 2 is a schematic diagram showing an example of an arrangement for producing a superconductor film for use in the embodiment the present invention.

FIG. 2 shows a schematic constitution of a known method of producing the superconductor magneto-resistive element 14 utilizing a spray pyrolysis method.

An oxide superconductor film made of composition of Y-Ba-Cu-O groups is formed on a substrate 13 which is fixed onto a base plate 17. The base plate 17 is heated at a temperature of generally 600° C. by a heater 12. On the other hand, compositions of nitrate represented by $Y(NO_3)_3 \cdot 6H_2O$, $Ba(NO_3)_2$ and $Cu(NO_3)_2 \cdot 3H_2O$, which are materials of the superconductor film, were measured to be a composition having a predetermined component elements ($YBa_2Cu_3$), thereafter the measured nitrate materials were solved in a solution 7 and the solution 7 containing the nitrate materials was saved in a tank 8 of a sprayer gun 9. Thereafter, the solution 7 saved in the tank 8 was made into fine moisture 11 and sprayed onto the substrate 13 by means of the sprayer gun 9 little by little under high pressure air fed through a pipe 10. The moisture 11 sprayed onto the substrate 13 was made into a ceramic layer oxide formed by thermal decomposition at a temperature of generally 600° C. with heat applied to the substrate 13 by the heater 12.

The oxide film formed on the substrate 13 was made generally 10 μm in thickness, thereafter the oxide film was subjected to a thermal treatment in the air for several minutes, whereby a film having a desired superconductor characteristic was obtained.

In addition, in this embodiment, although the oxide superconductor film 2 was composed of Y group materials, the oxide superconductor film 2 may be composed of other materials such as Bi group or Tl group, and other methods such as a sputtering or CVD method may be utilized for forming the superconductor film 2 besides the spray pyrolysis method.

A good result was obtained when the superconductor film 2 of the element 14 was formed in a range of 1 μm to 10 μm in thickness.

Figure 3:
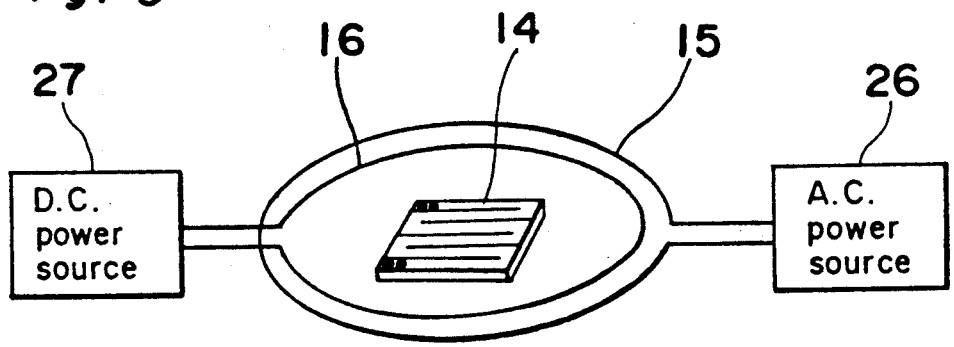
FIG. 3 is a schematic diagram showing a general structure of a superconductor magneto-resistive element according to the invention shown in FIG. 1.

As shown in FIG. 3, the superconductor magneto-resistive element 14 is installed in a center portion surrounded by two coils 15 and 16 which generates bias magnetic fields in the same direction, thereby constituting a magnetic field sensor portion, wherein the circuit lines shown in FIG. 1(a) are omitted for brevity. It becomes possible to measure a magnetic field with high accuracy using such a magnetic field sensor and the measurement operation using the magnetic field sensor was performed in a magnetically shielded room preventing an influence of a magnetic noise.

The coil 15 is connected to an A.C. power source 26 for applying A.C. bias magnetic field and the coil 16 is connected to a D.C. power source 27 for applying D.C. magnetic field to the element 14.

Figure 4:
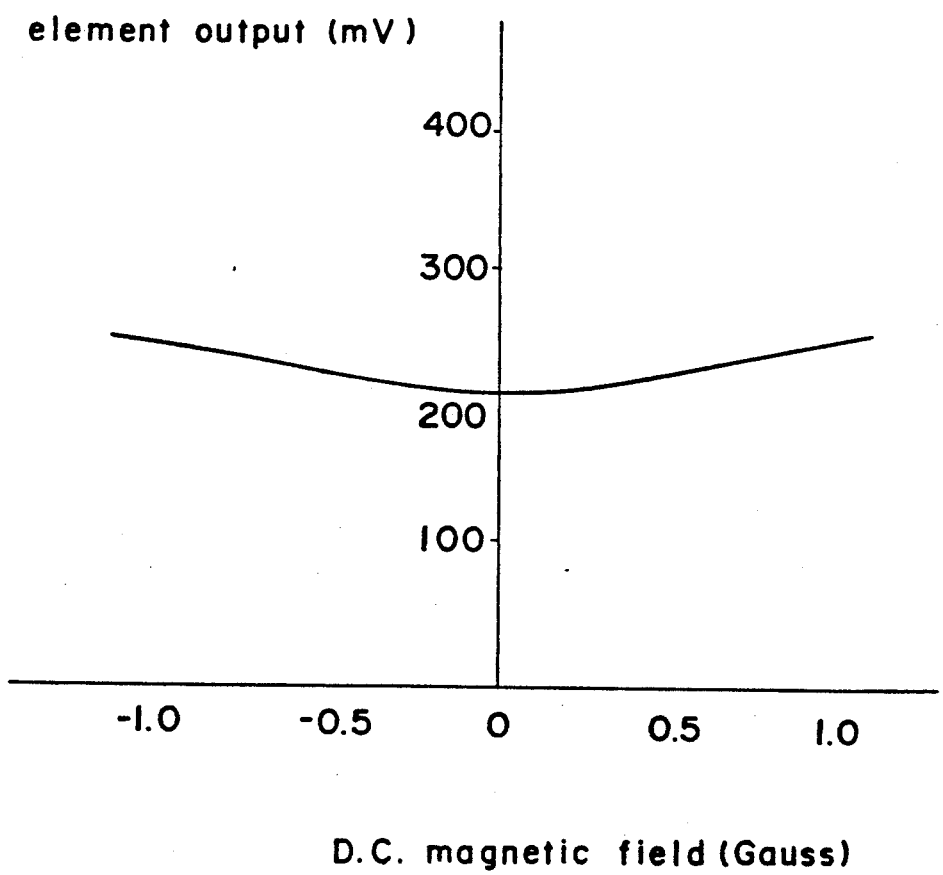
FIG. 4 is a graph showing a characteristic curve between D.C. bias magnetic field and output voltage of the superconductor magneto-resistive element for use in the embodiment.

FIG. 4 shows an example of a voltage output characteristic of the superconductor magneto resistive element 14 across the voltage terminals 4a and 4b in the measurement using the magnetic field sensor as mentioned above. The output characteristic shown in FIG. 4 is obtained under such a condition that bias current of 10 mA is kept to be supplied for flowing through the current terminals 3a and 3b of the element 14, while the intensity of the D.C. bias magnetic field generated by the coil 16 to be applied to the element 14 is varied. The vertical axis of FIG. 4 shows the voltage output of the element 14 and the horizontal axis of FIG. 4 shows the intensity of the D.C. bias magnetic field applied by the coil 16.

Figure 5:
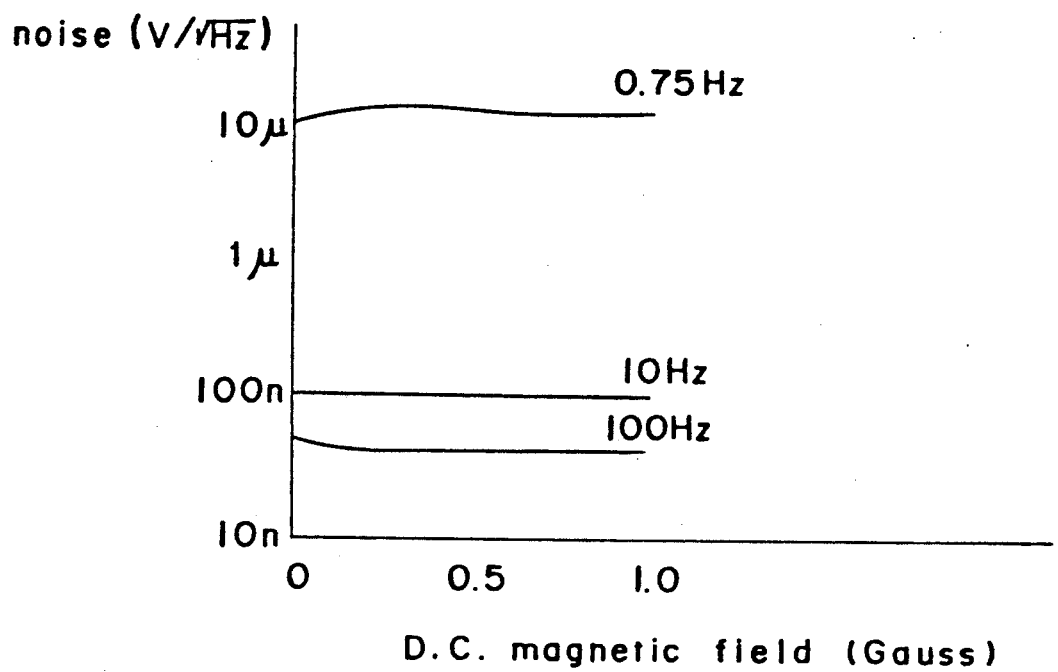
FIG. 5 is a graph showing characteristic curves between D.C. bias magnetic field and noise of the superconductor magneto-resistive elements.

In FIG. 5, the vertical axis of the graph shows the intensity of noise included in the output of the element 14 in various frequencies such as 0.75 Hz, 10 Hz and 100 Hz when the element 14 is operated under the same condition as shown in FIG. 4 with the D.C. bias magnetic field changed as shown in the horizontal axis in FIG. 5.

As shown in FIG. 5, it is understood that the intensity of noise generated by the element 14 is little changed when varying the intensity of the applied D.C. bias magnetic field, but when the noise is analyzed into frequency components, the noise in a range of a low frequency level below several hertz is relatively large. That is to say, FIG. 5 shows that a precise measurement of D.C or low frequency magnetic field is difficult in measurement by applying a D.C bias magnetic field to the superconductor magneto-resistive element 14 because the measurement of the D.C. or low frequency magnetic field is affected by the noise.

In the preferred embodiment of the magnetic field sensor system according to the present invention, a D.C. magnetic field and low frequency magnetic field can be precisely measured preventing an influence of low frequency components of the noise inherent in the superconductor magneto-resistive element 14. Moreover, in the preferred embodiment, by correcting the change of the output due to the temperature fluctuation of the superconductor magneto-resistive element 14 which is generated when the element 14 is cooled to be in a superconductive state, it becomes possible to measure a feeble external magnetic field with high accuracy.

FIGS. 6(a) to 6(f) show A.C. output waveforms of the element 14 when an A.C. bias magnetic field is applied to the element 14 by the coil 15 in the embodiment of the present invention, wherein FIG. 6(a) shows a sinusoidal A.C. magnetic field of ±100 milligauss which is applied to the element 14 with A.C. current of 1 kilohertz being supplied to the coil 15 as shown in FIG. 3.

Figure 7:
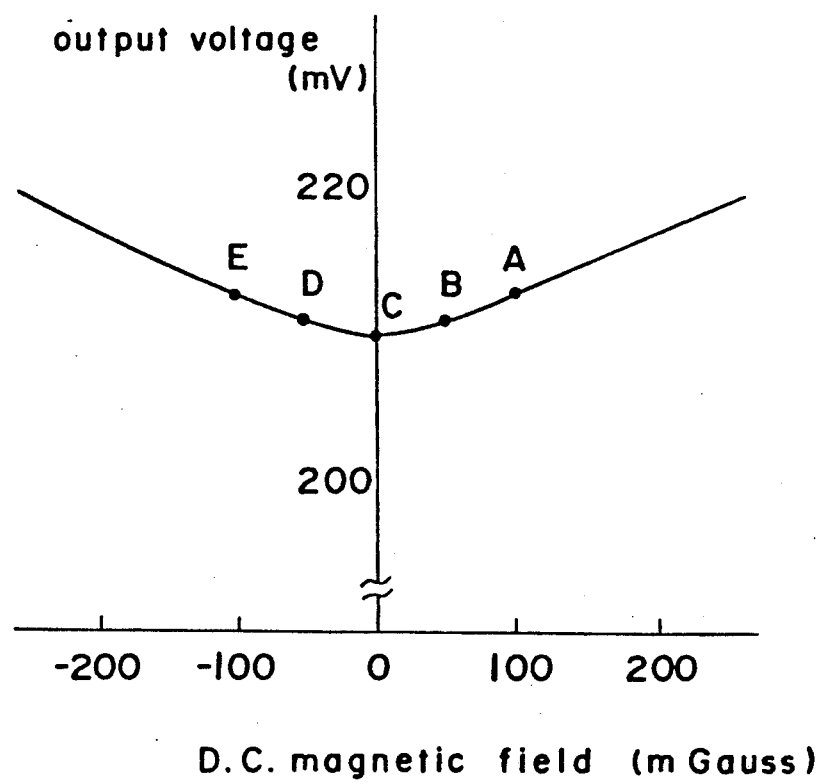
FIG. 7 is a graph view showing the operation points of FIGS. 6.

Under the condition that the A.C. magnetic field is applied to the element 14 by supplying A.C. current to the coil 15, a D.C. magnetic field of a predetermined intensity is applied to the element 14 in addition by supplying predetermined D.C. current to the coil 16, and under this condition, the output characteristic of the element 14 is shown in FIG. 7. That is to say, when various intensities of the D.C. bias magnetic fields shown by the points A to E in FIG. 7 having the contents explained in relation to FIG. 4 are applied to the element 14, the waveforms generated at the output of the element 14 corresponding to the above intensities of the magnetic field are as shown in FIGS. 6(b) to 6(f) corresponding to the points A to E shown in FIG. 7.

Figure 8:
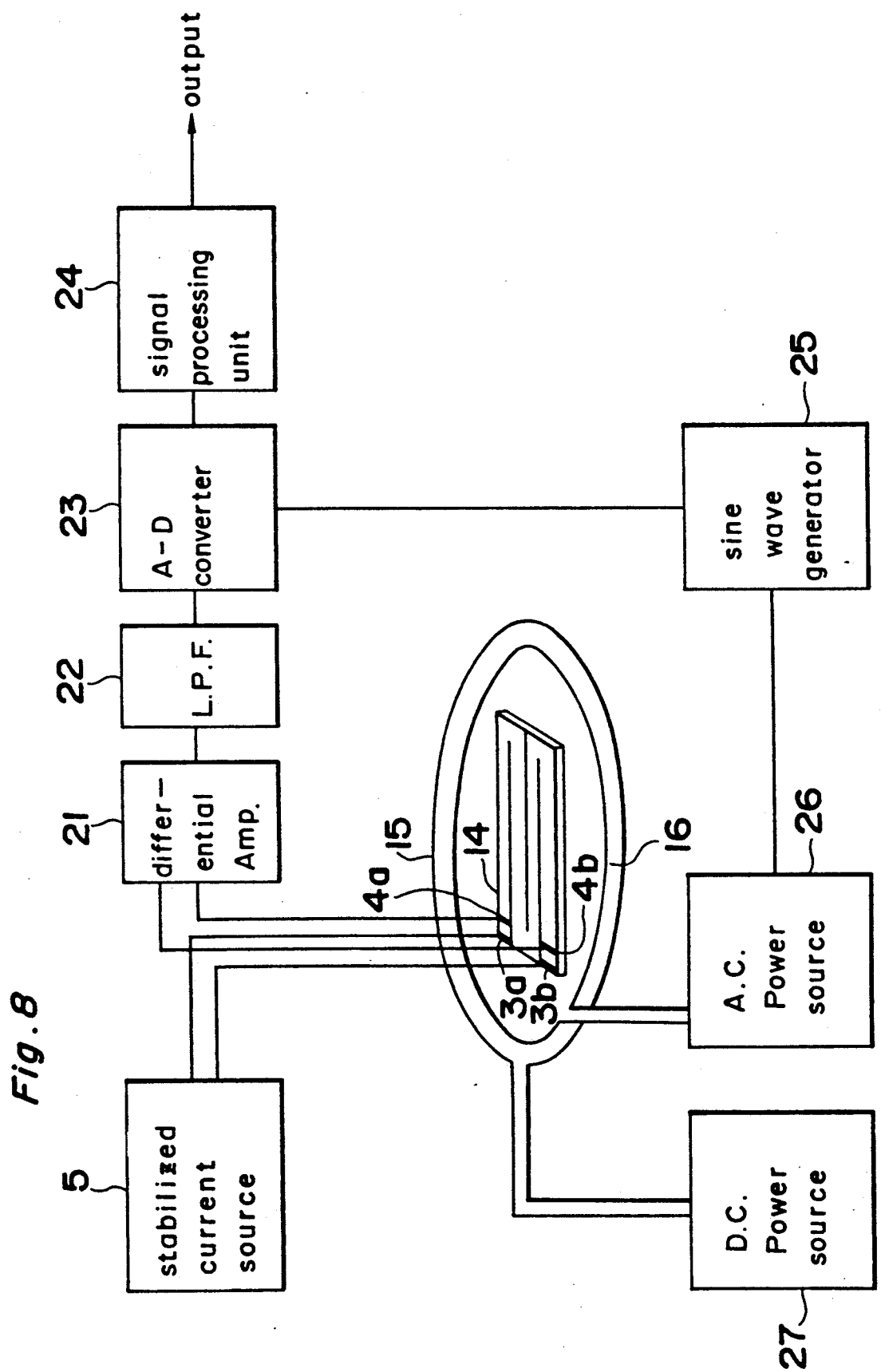
FIG. 8 is a block diagram showing an embodiment of a magnetic field sensor system according to the present invention, FIGS. 9(a) to (9d) are schematic diagrams showing waveforms for explaining the A/D conversion of the output signal of the element.

The output signals of the element 14 with the output waveforms shown in FIGS. 6(a) to 6(f) are processed by a magnetic field sensor system provided with a magnetic field sensor connected thereto as shown in FIG. 8, whereby the change of the output of the element 14 due to the fluctuation inherent in the element 14 mentioned above is corrected by processing the output signal.

FIG. 8 shows a general structure of the superconductor magnetic field sensor system. The output from the voltage terminals 4a and 4b of the superconductor magneto-resistive element 14 is inputted to a differential amplifier 21 and amplified by 20 times, thereafter the output of the amplifier 21 is inputted to an analogue-to-digital (referred to as A/D hereinafter) converter 23 through a low-pass filter 22 having its cut-off frequency of 2.5 kHz so as to eliminate the effect of the return noise generated by the element 14.

The output of the low pass filter 22 is A/D converted by the A/D converter 23, and the digital output signal of the A/D converter 23 is inputted to a digital signal processing unit 24.

Figure 9:
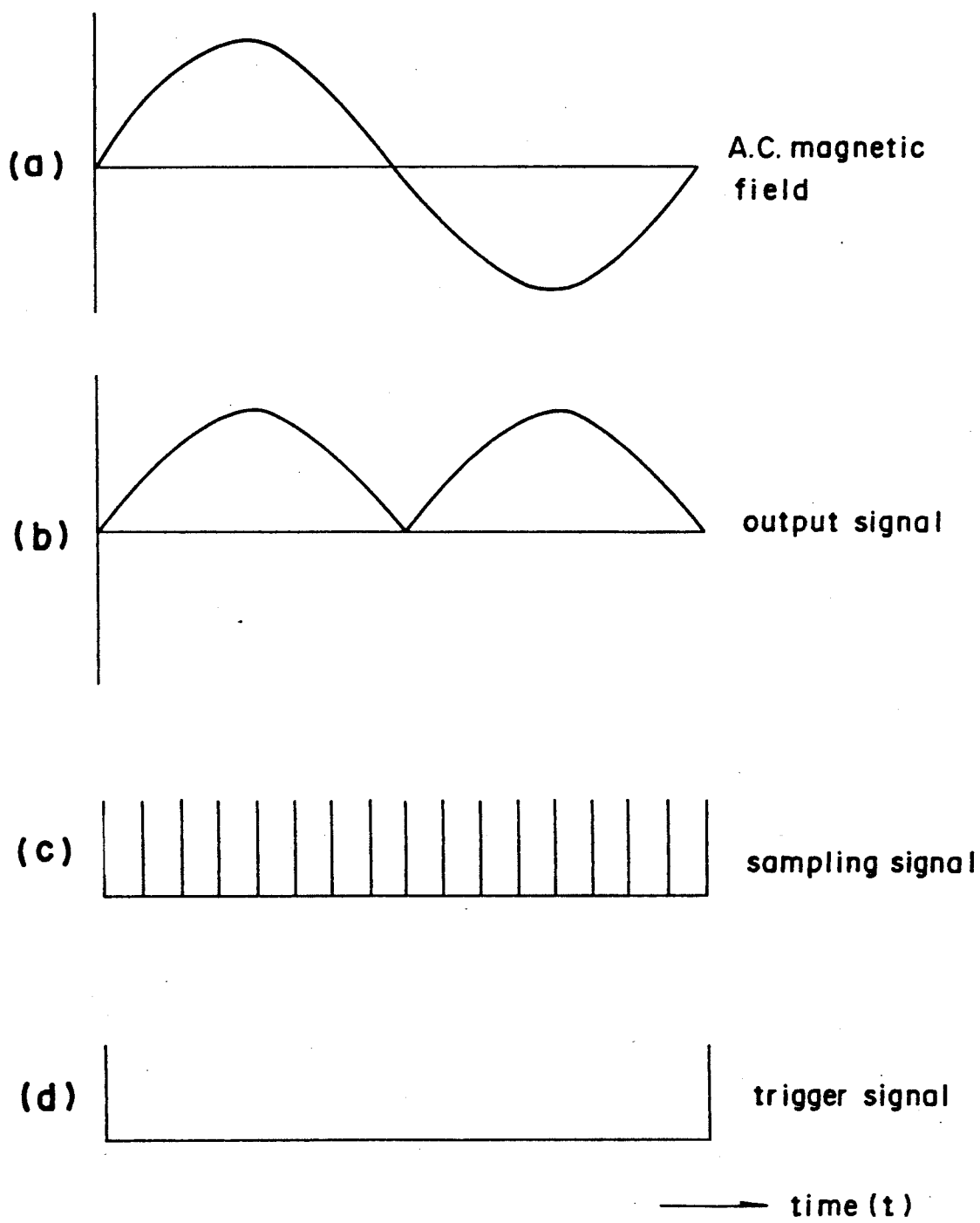

The A/D conversion performed by the A/D converter 23 is explained with reference to FIGS. 9(a) to 9(d). FIG. 9(a) shows a waveform of an A.C. bias magnetic field applied to the element 14 by supplying A.C. current to the coil 15, and FIG. 9(b) shows the waveform of the output signal of the element 14 when the A.C. bias magnetic field is applied to the element 14. With use of two kinds of timing signals such as a sampling signal shown in FIG. 9(c) and trigger signal shown in FIG. 9(d) transmitted from a sine wave generator 25 for generating an A.C. magnetic field at this time, the A/D conversion is performed by the A/D converter 23 synchronizing with the application of the A.C. magnetic field.

The A/D conversion is performed by the A/D converter 23 of 16 bits in which the sampling operations are performed 16 times at regular intervals during one period of the A.C. magnetic field mentioned above, thereby obtaining the digital output signal.

With the digital output signal of the A/D converter 23, the fundamental component having the frequency component same as that of the A.C. bias magnetic field and the quadratic harmonic component having the frequency component twice as that of the fundamental component are calculated using the Fourier transform. That is to say, the fundamental component corresponds to the component of order 1 of the Fourier series and the quadratic harmonic component corresponds to the component of order 2 of the Fourier series of the periodic quantity of the A.C. bias magnetic field. The calculated value of the fundamental component is divided by the value of the quadratic harmonic component, thereby removing the change of the output signal of the element 14 due to the fluctuation inherent in the element 14.

In this embodiment, since the A.C. bias magnetic field of 1 kHz is used, only 1 kHz and 2 kHz components of the output of the element 14 are taken out with a narrow band. Therefore, it becomes possible to suppress the effective value of the noise in a low frequency range generated by the element 14.

In a principle theory, the digital output signal of the A/D converter 23 is processed by the signal processing unit 24 which is connected to the A/D converter 23 and the digital signal processing operation performed by the signal processing unit 24 is explained as following.

As described above, the analogue output signal of the low pass filter 22 is A/D converted by the A/D converter 23 so as to obtain discrete digital values, which are numerically analyzed using the discrete Fourier transform. That is to say, a real variable function x(t) is expanded by the Fourier transform as follows.

$$x(t) = \frac{1}{2} a_0 + a_1 \cos t + \ldots + a_{\frac{N}{2}-1} \cos\left(\frac{N}{2}-1\right)t + \quad (1)$$

$$\frac{1}{2} a_{\frac{N}{2}} \cos \frac{N}{2} t + b_1 \sin t + \ldots + b_{\frac{N}{2}-1} \sin\left(\frac{N}{2}-1\right)t$$

wherein each factor of the component of order N of the discrete Fourier series (1) is represented as follows:

$$a_k = \frac{2}{N} \sum_{j=0}^{N-1} X_j \cos \frac{2\pi}{N} kj, \; 0 \leq k \leq \frac{N}{2} \quad (2)$$

$$b_k = \frac{2}{N} \sum_{j=0}^{N-1} X_j \sin \frac{2\pi}{N} kj, \; 1 \leq k < \frac{N}{2} \quad (3)$$

herein, $X_j$ represents the input data, N represents the number of data.

According to the present embodiment, the digital data signal of 16 bits are processed by the signal processing unit 24 at a high velocity so as to calculate the respective frequency components.

In this embodiment, the number of the input data is 128, which corresponds to that in eight periods, wherein the data are sampled 16 times in each period.

In the way of cooling the element 14 to be in a superconductive state, since the element 14 is immersed in liquid nitrogen saved in a heat insulating tank and cooled by evaporation of the liquid nitrogen, the temperature fluctuation of the element can not be avoided. Therefore, in the conventional method of measuring a magnetic field with use of only the fundamental component, the error of the fluctuation of the output data due to the temperature characteristic of the element 14 was involved.

On the other hand, in the preferred embodiment according to the present invention, the quadratic harmonic component together with the fundamental component are used as described above. That is to say, in accordance with the characteristic of the element 14, the quadratic harmonic component of the output signal is not dependent on the intensity of the external magnetic field but dependent only on the change of the characteristic due to the temperature of the element in a range of a predetermined magnetic field. On the other hand, the fundamental component of the output signal is effected by the change of the output signal of the element due to the intensity of the external magnetic field and due to the temperature fluctuation. Therefore, the fundamental component is divided by the quadratic harmonic component, whereby it becomes possible to remove only the noise component generated due to the temperature fluctuation of the element from the fundamental component. Accordingly, comparing to the conventional method of measuring only the fundamental component using a differential lock-in amplifier, in the method of the present invention the fluctuation of the output value can be reduced to a degree of one-fifth.

Next, the signal processing operation mentioned above is schematically explained with reference to FIGS. 10(a) to 10(c).

Figure 10:
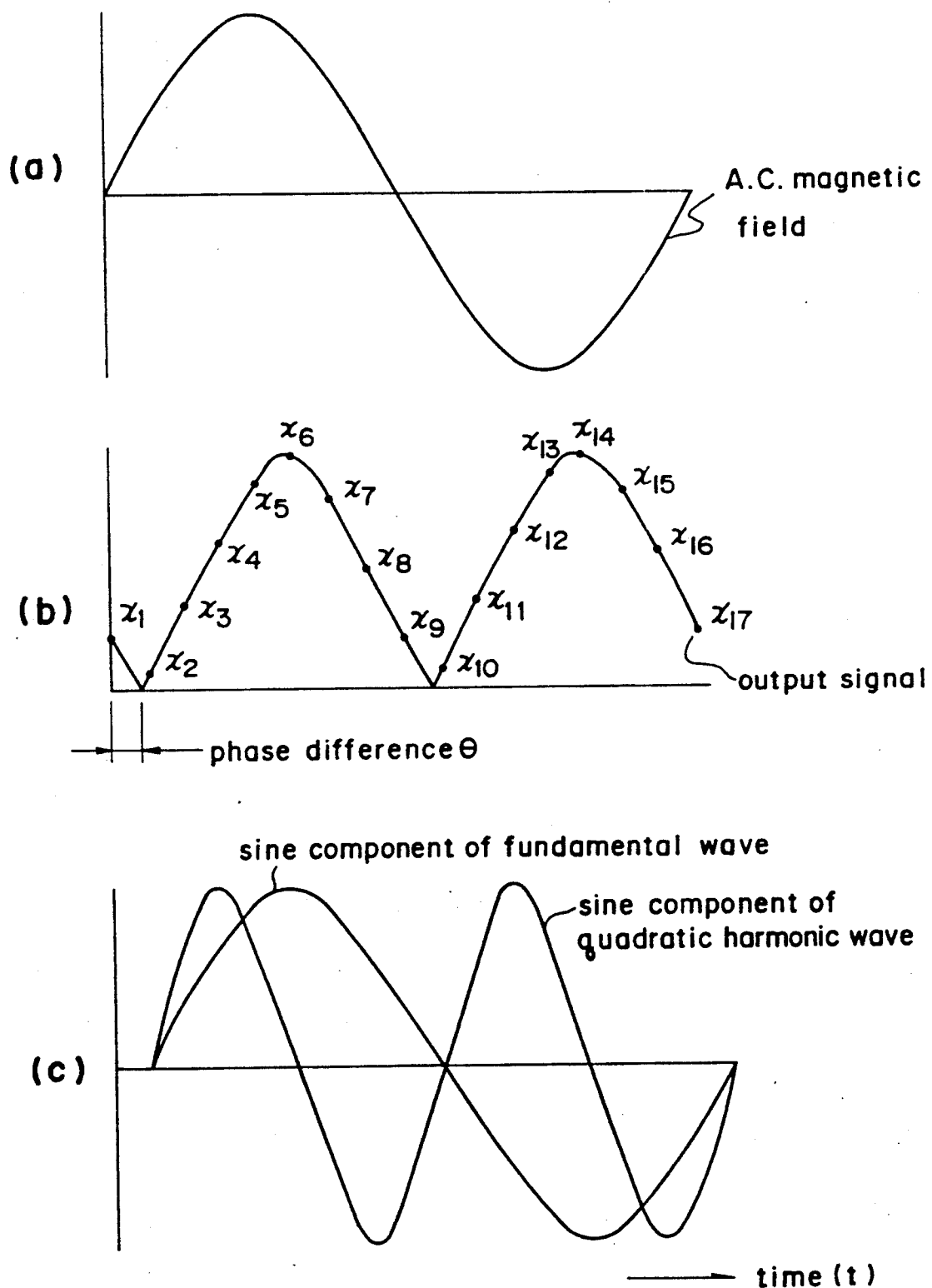
FIGS. 10(a) to 10(c) are schematic diagrams showing waveforms for explaining the correction of the phase difference between the A.C. bias magnetic field and the output signal of the element.

The phase difference 8 between the A.C. magnetic field applied to the element 14 shown in FIG. 10(a) and the output signal of the element 14 having the same period shown in FIG. 10(b) is measured and the respective factors of the Fourier series are corrected as following expressions (4) and (5), thereby obtaining the respective sine wave components of the fundamental wave and quadratic harmonic wave.

$$a_k = \frac{2}{N} \sum_{j=0}^{N-1} X_j \cos\left(\frac{2\pi}{N} k_j - \theta\right), 0 \leq k \leq \frac{N}{2} \quad (4)$$

$$b_k = \frac{2}{N} \sum_{j=0}^{N-1} X_j \sin\left(\frac{2\pi}{N} k_j - \theta\right), 1 \leq k < \frac{N}{2} \quad (5)$$

Assuming that the cosine and sine components of the fundamental wave are respectively C1 and S1 and that the cosine and sine components of the quadratic harmonic wave are respectively C2 and S2, the absolute components M1 and M2 of the fundamental and quadratic harmonic frequencies are respectively obtained by the following expressions (6) and (7).

$$M1 = \sqrt{C1^2 + S1^2} \quad (6)$$

$$M2 = \sqrt{C2^2 + S2^2} \quad (7)$$

By these calculations, the output values are obtained by the calculations (8) and (9) as follows:

$$(fundamental\ sine\ component)/(quadratic\ harmonic\ absolute\ components) = S1/M2 \quad (8)$$

$$(fundamental\ absolute\ component)/(quadratic\ harmonic\ absolute\ component) = M1/M2 \quad (9)$$

From the equation (8), it becomes possible to measure the external magnetic field component with its polarity in the same direction as that of the applied A.C. magnetic field. From the equation (9), it becomes possible to measure the absolute value of the external magnetic field component without polarity in the same direction as that of the applied A.C. magnetic field. As described above, the noise of the fluctuation component corresponding to the phase difference between the output value of the magnetic field sensor and the applied A.C. magnetic field is corrected by the calculation performed by the signal processing unit 24.

Figure 11:
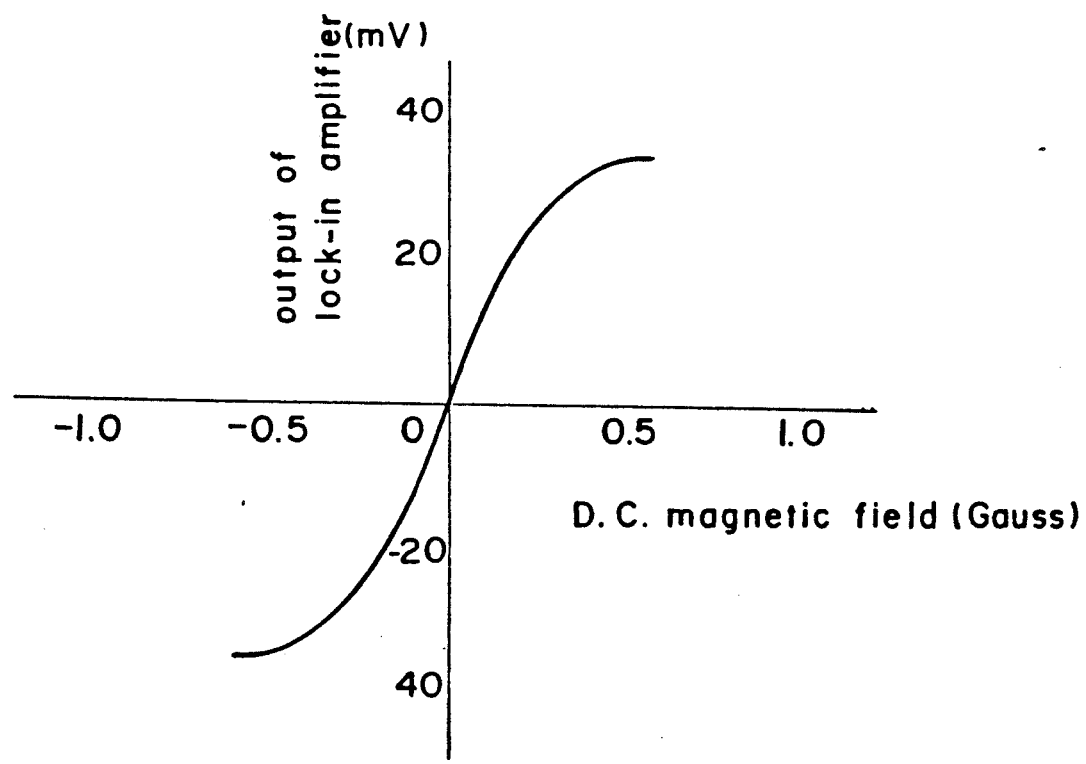
FIG. 11 is a graph view showing an output characteristic curve between the D.C. magnetic field and the output signal of the element.

The resultant values of measuring the magnetic field in such a manner as described above are shown in FIG. 11. The horizontal axis of FIG. 11 represents the intensity of the measured external magnetic field and the vertical axis thereof represents the output voltage value of the superconductor magnetic field sensor system of the preferred embodiment using the calculation represented by the equation (8) In order to reduce the calculation time, the signal processing operation can be also performed using a substitution method of measurement in which the quadratic harmonic component M2 is replaced by the cosine component C2 thereof. Moreover, such calculations are not limited to these examples and other appropriate combination of the calculations can be also employed.

Although the present invention has been fully described with reference to the preferred embodiment, it is not limited to this but it is possible to change the measurement range of the magnetic field to be measured and the accuracy of the measurement by adjusting the bias current supplied to the superconductor magnetoresistive element, intensity of the A.C. bias magnetic field, its frequency, presence or absence of the D.C. bias magnetic field and change of the intensity of the D.C. bias magnetic field.

Moreover, in processing the output signal of the element 14, it is possible to change the resolution of the A/D converter 23 and the sampling times in each period to any times equal to or more than four times in one period of the applied A.C. bias magnetic field. In addition, it is also possible to change the sampling number for obtaining the respective components at each sampling point to set in any number more than that in one period.

Furthermore, in the present embodiment, although the output signal of the element 14 is A/D converted by the A/D converter before the signal is processed by the signal processing unit, the output signal of analogue form can be also processed by an analogue signal processing method.

In addition, in the present embodiment, although two coils for separately supplying D.C. current and A.C. current are used to generate the D.C. and A.C. bias magnetic fields, the A.C. bias magnetic field and D.C. bias magnetic field may be generated by one coil by supplying A.C. current and D.C. current to the same coil.

It is also possible to provide the coil for applying the bias magnetic fields in the thin film shape formed on the substrate on which the superconductor magneto-resistive element film is provided, whereby it is possible to stabilize the magnetic field sensing operation and to facilitate manufacturing of the magnetic field sensor system.

In the magnetic field sensor system according to the present invention, there is applied a high frequency A.C. bias magnetic field for suppressing the effect of the noise of a natural low frequency lower than several hertzs inherent in the element, and by using the frequency component of the A.C. bias magnetic field taken out of the output of the element corresponding to the applied A.C. bias magnetic field and quadratic harmonic components, it becomes possible to correct the change of the output of the element due to the temperature fluctuation of the element caused when the element is cooled to be set in the superconductive state, so that even a feeble magnetic field can be accurately measured with high sensitivity.

In addition, since the sensitivity of the superconductor magneto-resistive element is not depended on the size of the shape thereof, it is possible to make the element and coils small in size, so that it becomes possible to sensor an external magnetic field in a minute space, resulting in that the magnetic field sensor system can be utilized in various fields such as a medical treatment and non-destructive test.

It is to be noted here that various changes and modifications will be apparent to those skilled in the art without departing from the spirit and scope of the invention as defined by the appended claims.

What is claims is:

1. A magnetic field sensor system for sensing an external magnetic field using a superconductor magneto-resistive element composed of a superconductor member having weak coupling grain boundaries, said system comprising:
    means for applying an A.C. bias magnetic field to said element and generating an output signal of said element including a noise inherent in said element;
    means for taking out two kinds of frequency components from the output signal of said element, one of said frequency components corresponding to the fundamental component of the applied A.C. bias magnetic field and the other frequency component corresponding to the quadratic harmonic component of the applied A.C. bias magnetic field; and
    calculation means for comparing both of the two frequency components taken out from the output signal of said element and dividing the fundamental component by the quadratic harmonic component, thereby obtaining a signal for measuring the intensity of the external magnetic field reducing the noise generated by said element.

2. The magnetic field sensor system as defined in claim 1, further comprising means for applying a D.C. bias magnetic field to said superconductor magneto-resistive element.

3. The magnetic field sensor system as defined in claim 1, wherein the output signal of said element is a voltage signal.

4. The magnetic field sensor system as defined in claim 1, wherein said means for applying the A.C. bias magnetic field includes a first coil for applying the A.C. bias magnetic field to said element installed in the center portion of the coil.

5. The magnetic field sensor system as defined in claim 2, wherein said means for applying the D.C. bias magnetic field includes a second coil for applying the D.C. bias magnetic field to said element installed in the center portion of the coil.

* * * * *